(12) United States Patent  (10) Patent No.: US 8,492,753 B2
Yager  (45) Date of Patent: Jul. 23, 2013

(54) DIRECTIONALLY RECRYSTALLIZED GRAPHENE GROWTH SUBSTRATES

(75) Inventor: Thomas A. Yager, Encinitas, CA (US)

(73) Assignee: Empire Technology Development LLC, Wilmington, DE (US)

( * ) Notice: Subject to any disclaimer, the term of this patent is extended or adjusted under 35 U.S.C. 154(b) by 132 days.

(21) Appl. No.: 13/129,371

(22) PCT Filed: Sep. 28, 2010

(86) PCT No.: PCT/US2010/050566
§ 371 (c)(1),
(2), (4) Date: May 11, 2011

(87) PCT Pub. No.: WO2012/044284
PCT Pub. Date: Apr. 5, 2012

(65) Prior Publication Data
US 2012/0286234 A1  Nov. 15, 2012

(51) Int. Cl.
*H01L 29/08* (2006.01)
*H01L 35/24* (2006.01)
*H01L 51/00* (2006.01)
*H01L 21/00* (2006.01)
*H01L 51/40* (2006.01)

(52) U.S. Cl.
USPC .............. 257/40; 257/E29.007; 257/E51.038; 438/82; 438/99

(58) Field of Classification Search
USPC .............. 257/40, E39.007, E51.038; 438/82, 438/99
See application file for complete search history.

(56) References Cited

U.S. PATENT DOCUMENTS

| 6,530,824 | B2 | | 3/2003 | Thomas et al. |
| 7,948,739 | B2 | * | 5/2011 | Zhamu et al. ................. 361/523 |
| 8,101,980 | B2 | * | 1/2012 | Heo et al. ...................... 257/288 |
| 8,105,928 | B2 | * | 1/2012 | Lin et al. ....................... 438/539 |
| 8,106,383 | B2 | * | 1/2012 | Jenkins et al. .................. 257/29 |
| 8,124,463 | B2 | * | 2/2012 | Chen et al. .................... 438/149 |
| 8,133,466 | B2 | * | 3/2012 | Shin et al. ..................... 423/448 |
| 8,158,200 | B2 | * | 4/2012 | Kelber ...................... 427/255.38 |
| 8,173,095 | B2 | * | 5/2012 | de Heer et al. ................ 423/448 |
| 8,187,955 | B2 | * | 5/2012 | Chu et al. ...................... 438/479 |
| 8,227,069 | B2 | * | 7/2012 | Kusunoki et al. ............. 428/141 |
| 8,227,842 | B2 | * | 7/2012 | Marinero et al. ............. 257/288 |
| 8,242,030 | B2 | * | 8/2012 | Hannon et al. ................ 438/765 |
| 2007/0187694 | A1 | * | 8/2007 | Pfeiffer ........................... 257/76 |
| 2009/0079040 | A1 | | 3/2009 | Schultz et al. |
| 2009/0110627 | A1 | * | 4/2009 | Choi et al. ................. 423/447.1 |
| 2009/0155561 | A1 | | 6/2009 | Choi et al. |
| 2009/0294759 | A1 | * | 12/2009 | Woo et al. ....................... 257/29 |
| 2010/0003462 | A1 | * | 1/2010 | Kamins et al. ................ 428/166 |
| 2010/0012176 | A1 | * | 1/2010 | Curtin et al. .................. 136/255 |

(Continued)

FOREIGN PATENT DOCUMENTS

FR    2932794 A1 * 12/2009
WO   2009129194 A2    10/2009

OTHER PUBLICATIONS

Australia Patent Office, International Search Report and Written Opinion of the International Searching Authority for PCT/US2010/050566, Nov. 2, 2010, Australia.

(Continued)

*Primary Examiner* — Ida M Soward (57) ABSTRACT

Implementations and techniques for producing substrates suitable for growing graphene monolayers are generally disclosed.

20 Claims, 7 Drawing Sheets

U.S. PATENT DOCUMENTS

| | | | |
|---|---|---|---|
| 2010/0021708 A1* | 1/2010 | Kong et al. | 428/220 |
| 2010/0181655 A1* | 7/2010 | Colombo et al. | 257/635 |
| 2010/0200839 A1 | 8/2010 | Okai et al. | |
| 2010/0218813 A1 | 9/2010 | Guha et al. | |
| 2010/0255984 A1* | 10/2010 | Sutter et al. | 502/185 |
| 2010/0285639 A1* | 11/2010 | Garcia et al. | 438/151 |
| 2010/0301336 A1* | 12/2010 | Babich et al. | 257/57 |
| 2010/0323164 A1* | 12/2010 | Ogihara et al. | 428/156 |
| 2011/0014457 A1* | 1/2011 | Quitoriano et al. | 428/336 |
| 2011/0033746 A1* | 2/2011 | Liu et al. | 429/209 |
| 2011/0189406 A1* | 8/2011 | Cho et al. | 427/523 |

OTHER PUBLICATIONS

Li, Xuesong, et al., Large-Area Synthesis of High-Quality and Uniform Graphene Films on Copper Foils, Science Magazine, Jun. 5, 2009, pp. 1312-1314, vol. 324, American Association for the Advancement of Science.

Kim, Keun Soo, et al., Large-scale pattern growth of graphene films for stretchable transparent electrodes, Nature, vol. 457, Feb. 5, 2009.

A Smarter Way to Grow Graphene, PHYSorg.com, May 14, 2008.

Reina, Alfonso, et al., Larger Area, Few-Layer Graphene Films on Arbitrary Substrates by Chemical Vapor Deposition, Nano Letters, vol. 9, No. 1, 30-35, Dec. 1, 2008.

Kline, J.E., et al., Laser Lateral Crystallization of Thin Au and Cu Films on SiO2, Matter. Res. Soc. Symp. Proc., vol. 875, O6.6.1-O6.6.6, 2005.

Levendorf, Mark P., et al., Transfer-Free Batch Fabrication of Single Layer Graphene Transistors, Nano Letters, vol. 9, No. 12, Oct. 27, 2009.

Vopsaroiu, M., et al. Grain Size Effects in Metallic Thin Films Prepared Using a New Sputtering Technology, Journal of Optoelectronics and Advanced Materials, vol. 7, No. 5, p. 2713-2720, Oct. 2005.

Krauss, B., et al., Laser-induced disassembly of a graphene single crystal into a noncrystalline network, Physical Review B, Apr. 2009, pp. 165428-1-165428-9, vol. 79, No. 165428, the American Physical Society.

"Graphene films clear major fabrication hurdle," accessed at http://phys.org/news189954890.html, dated Apr. 8, 2010, 2 pages.

Dassow, R., et al., "Laser crystallization of silicon for high-performance thin-film transistors," Semiconductor Science Technology, vol. 15, No. 10, pp. L31-L34 (2000).

Guinea, F., et al., "Gauge fields, ripples and wrinkles in graphene layers," Solid State Commun., vol. 149, pp. 1140-1143 (2009).

Lai, C-C, et al., "Quantitative Adhesion Analysis of Sputtered Copper Films on Glass Substrate by Microindentation Measurement," SID Symposium Digest of Technical Papers, vol. 37, Issue. 1, pp. 1882-1885 (2006).

Sutter, E., et al., "Graphene growth on polycrystalline Ru thin films," Appl. Phys. Lett., vol. 95, No. 13, pp. 133109-1-133109-3 (2009).

* cited by examiner

600 A computer program product.

602 A signal bearing medium.

604 at least one of one or more instructions for forming a metal layer on a substrate;

one or more instructions for forming a layer of dielectric material on the metal layer;

one or more instructions for directionally recrystallizing the metal layer to form a recrystallized metal layer suitable for growing a graphene monolayer, wherein the graphene monolayer has a length of at least one micron;

one or more instructions for removing the layer of dielectric material;

one or more instructions for forming the graphene monolayer on the directionally recrystallized metal layer;

one or more instructions for performing chemical vapor deposition (CVD) using a hydrocarbon gas mixture;

one or more instructions for using a laser to directionally recrystallize the metal layer;

one or more instructions for polishing the metal layer before forming the layer of dielectric material on the metal layer;

one or more instructions for forming a nickel (Ni) adhesion layer on the substrate; or one or more instructions for forming forming the copper (Cu) layer on the nickel (Ni) adhesion layer.

| 606 computer-readable medium. | 608 a recordable medium. | 610 a communications medium. |

DIRECTIONALLY RECRYSTALLIZED GRAPHENE GROWTH SUBSTRATES

BACKGROUND

Unless otherwise indicated herein, the approaches described in this section are not prior art to the claims in this application and are not admitted to be prior art by inclusion in this section.

Graphene, a generally planar monolayer array of carbon atoms, may be grown using chemical vapor deposition (CVD) on substrate surfaces coated with nickel (Ni), ruthenium (Ru), or copper (Cu) layers. However, defects in graphene production, such as the nucleation of multilayer graphene, may occur at metal grain boundaries in a graphene substrate's growth layer. Control of the morphology of the growth layer may improve the morphology of graphene films by limiting the number of metal grain boundaries and hence the occurrence of production defects such as multilayer graphene.

Directional crystallization (also known as Excimer Laser Annealing) has been used to control the morphology of silicon (Si) layers in Active Matrix Liquid Crystal Display (AM-LCD) devices. Using this technique, amorphous or poly-Si material may be transformed to large grain Si by melting a Si layer in a narrow region in a few nanoseconds. By scanning a laser across a film surface, molten regions may nucleate on already cooled regions allowing film grains to grow and extend in the direction of the laser motion. A single pass may produce elongated grains in the film. A second pass perpendicular to the first pass may produce large equiaxed film grains.

SUMMARY

Processes and/or methods of forming substrates suitable for growing graphene are generally described including forming a metal layer on a prepared substrate, forming a layer of dielectric material on the metal layer, and then directionally recrystallizing the metal layer to form a recrystallized metal layer suitable for growing a graphene monolayer having a length of about fifteen microns or greater.

In addition, systems and/or devices are generally described including an apparatus having a layer of dielectric material adjacent to a substrate and a directionally recrystallized metal layer adjacent the layer of dielectric material where the directionally recrystallized metal layer is suitable for growing a graphene monolayer at least about fifteen microns in length. An example system includes one or more devices configured to form a metal layer on a substrate, form a dielectric layer on the metal layer, and directionally recrystallize the metal layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the embodiments of the present disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatus, articles and systems related to directionally recrystallized substrates suitable for growing graphene monolayers.

In accordance with various implementations of the present disclosure, a polycrystalline metal film may be recrystallized using laser directional crystallization techniques. The recrystallized metal film or layer may be used as a graphene growth substrate. In various implementations, processes described herein may be applied to patterned thin film metal on substrates such as semiconductor substrates.

In accordance with various implementations of the present disclosure, a base substrate, such as a silicon substrate, may be provided. The substrate may be coated with a layer of silicon dioxide ($SiO_2$). In some implementations the substrate may be a controlled thermal expansion substrate. The substrate may then be coated with a metal film or layer that may, at a later stage, be used to grow a graphene monolayer. In some implementations the metal layer may include a nickel (Ni) adhesion layer and about a 500 µm thick layer of copper (Cu) formed on the adhesion layer. In various examples, other adhesion layer materials such as chromium (Cr) may be employed. Further, in various examples the Cu layer thickness may range from about 200 μm to about 800 μm. A cap layer of dielectric material such as silicon dioxide ($SiO_2$) may then be formed on the metal layer. In some examples, the $SiO_2$ cap layer may be about 500 nm to about 700 nm in thickness.

In accordance with various implementations of the present disclosure, the metal layer may then be subjected to directional recrystallization using a laser. In various examples, directional recrystallization may be undertaken using an excimer laser and substrate transport system. Subsequent to recrystallization, the substrate bearing the recrystallized metal layer and cap layer may be provided as a prepared substrate having a metal layer suitable for forming a graphene monolayer.

In accordance with various implementations of the present disclosure, after recrystallization of the metal layer, the $SiO_2$ cap layer may be removed utilizing standard wet or dry etch processes. Subsequent to removing the cap layer, a graphene monolayer may be formed on the directionally recrystallized metal layer. In various examples, graphene may be formed on the directionally recrystallized metal layer by performing Chemical Vapor Deposition (CVD) using a mixture of hydrogen ($H_2$) and methane ($CH_4$) gases.

In accordance with various implementations of the present disclosure, the graphene monolayer may be separated from the substrate. In various examples the graphene monolayer may be removed by coating the graphene monolayer with polydimethylsiloxane (PDMS) or poly-methyl methacrylate (PMMA) and then subjecting the substrate to a soft bake. In examples employing silica-based substrates the substrate may be removed by abrasively thinning followed by chemical etching using solutions of hydrofluoric (HF) or fluoroboric ($HBF_4$) acid. Other substrates can be removed by using acid etch solutions. In examples where the metal layer is a copper layer it can then be removed using an etching solution containing iron nitrate ($Fe(NO_3)_3$). The resulting graphene monolayer may then be transferred to a test structure or circuit and the protective coating may be removed using acetone or photoresist strippers.

Figure 1:
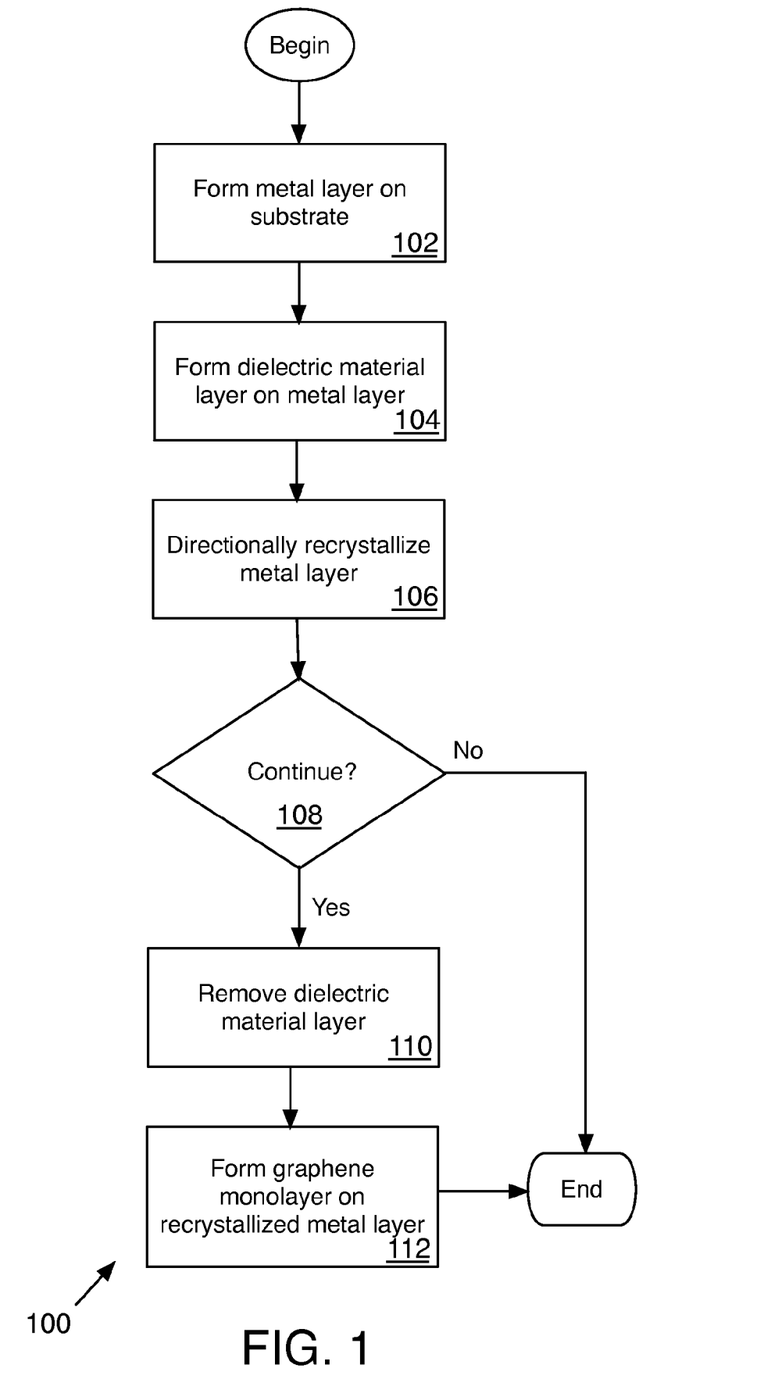
FIG. 1 is an illustration of an example process for the manufacture of substrates suitable for growing graphene and/or for the manufacture of graphene on suitable substrates.

FIG. 1 illustrates a flow diagram of a process 100 for the manufacture of substrates suitable for growing graphene monolayers and/or for the manufacture of a graphene monolayers on such substrates in accordance with at least some embodiments of the present disclosure. FIGS. 2A-2F illustrate example structures associated with portions of process 100 in accordance with at least some embodiments of the present disclosure. Process 100 may include one or more operations, functions or actions as illustrated by one or more of blocks 102, 104, 106, 108, 110 and/or 112. Process 100 may begin at block 102.

Figure 2A:
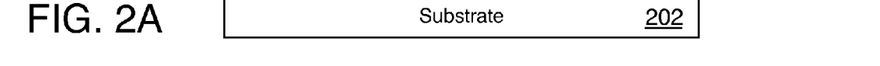
FIGS. 2A-2F are illustrative diagrams of example structures associated with the process of FIG. 1.
Figure 2B:
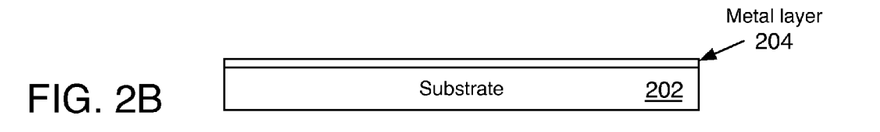

At block 102, "FORM METAL LAYER ON SUBSTRATE", a metal layer may be formed on a substrate. In various implementations, the metal layer formed in block 102 may include one or more of nickel (Ni), ruthenium (Ru) and/or copper (Cu) to name several examples. For example, a metal layer formed in block 102 may include a nickel (Ni) adhesion layer and a thick layer of copper (Cu) may be formed on the Ni adhesion layer. In some examples the layer of copper may have a thickness in a range from about 250 μm to about 750 μm. FIGS. 2A and 2B illustrate the formation of a metal layer 204 on a substrate 202. As shown in the example of FIG. 2B, metal layer 204 may be formed on all of substrate 202, however, in various other implementations, metal layer 204 may be formed on only portions of substrate 202. For example, in various implementations, metal layer 204 may be formed on substrate 202 by lithographically patterning layer 204.

The metal layer formed in block 102 may be formed using various known techniques such as evaporation, sputtering, etc. For example, a 250 nm thick layer of Cu may be deposited on the substrate with a sputter deposition system or tool having a working pressure of about 5 mTorr of argon (Ar) and about 150 W target power. In various implementations, the substrate may be one or more of silicon (Si), $SiO_2$, alumina or aluminum oxide ($Al_2O_3$), and/or a controlled thermal expansion substrate. For example, substrate 202 may be a controlled thermal expansion substrate having a coefficient of thermal expansion in a range of about $0.5 \times 10^{-6}$/K or more, such as fused $SiO_2$, beta-eucryptite, etc. In various implementations, the substrate 202 may be a silicon substrate having a $SiO_2$ surface layer. Process 100 may continue from block 102 to block 104.

Figure 2C:
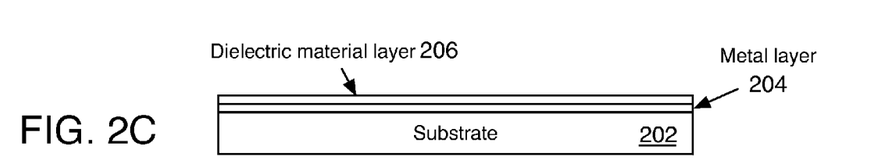

At block 104, "FORM DIELECTRIC MATERIAL LAYER ON METAL LAYER", a cap layer or dielectric material layer may be formed on the metal layer. In various implementations a cap layer of $SiO_2$ may be formed on the metal layer. For example, block 104 may include using known techniques to form a thick layer $SiO_2$ on the metal layer, with a thickness in a range from about 250 μm to about 750 μm. FIG. 2C illustrates the formation of a dielectric material layer 206 on metal layer 204. For example, a 600 nm thick layer of $SiO_2$ may be deposited at block 104 using a sputter deposition system or tool at a rate of about 2.57 nm/min. with a working pressure of about 5 mTorr Ar and a substrate bias of about 3 volts. Process 100 may continue from block 104 to block 106.

Figure 2D:
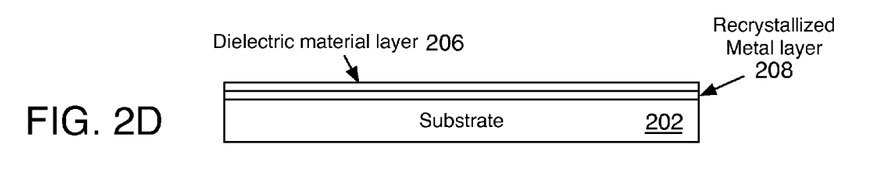

At block 106, "DIRECTIONALLY RECRYSTALIZE METAL LAYER", the metal layer may be directionally recrystallized. In various implementations, at least portions of metal layer formed in block 102 may be subjected to directional recrystallization in block 106 by heating the metal layer using a laser beam applied to the metal layer through the cap layer. FIG. 2D illustrates the formation of an at least partially recrystallized metal layer 208 from metal layer 204.

Figure 3A:
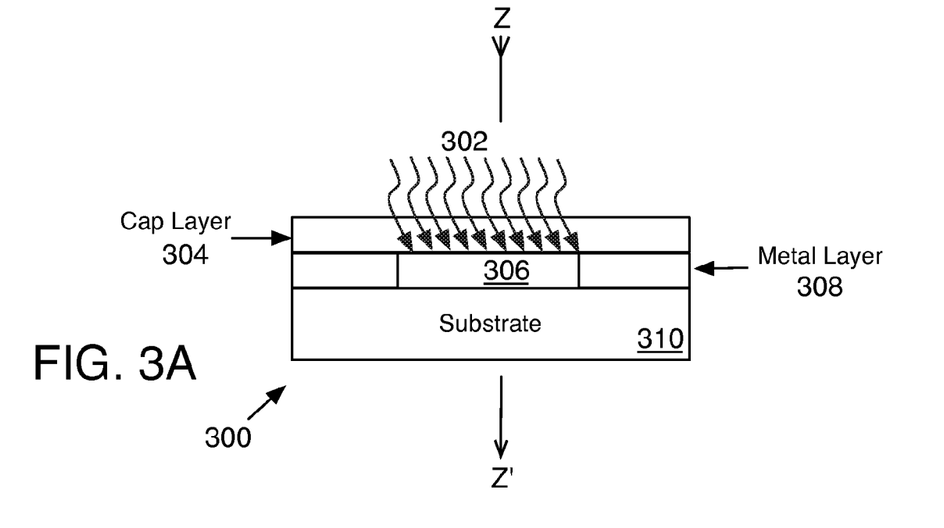
FIGS. 3A/3B are illustrative diagrams of an example structure associated with the process of FIG. 1.
Figure 3B:
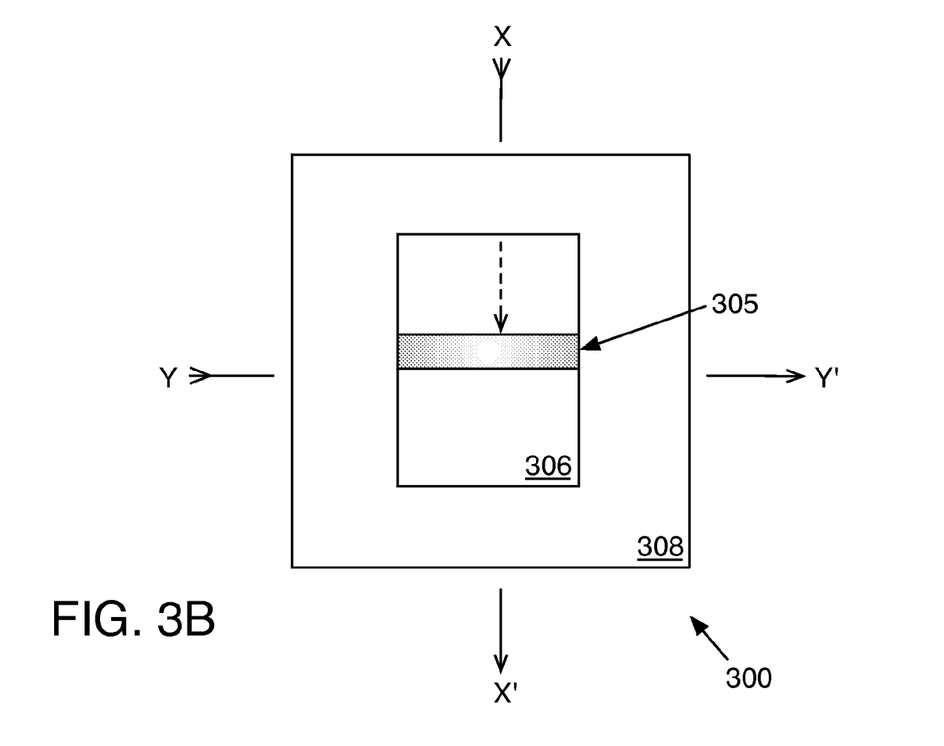

FIGS. 3A/3B illustrate an example structure 300 that may be associated with implementation of block 106 of process 100. In various implementations block 106 may include exposing the metal layer to projection irradiation in a single line beam configuration utilizing laser radiation scanned across at least portions of the metal layer. As shown in FIG. 3A, laser radiation 302 may be provided along an incidence of radiation direction Z-Z', which may pass through cap layer 304 and be absorbed by a selected portion 306 of metal layer 308 thereby melting portion 306. FIG. 3B depicts structure 300 as viewed looking down at layer 308 along radiation direction Z-Z'.

Upon removal of laser radiation 302, the part metal layer portion 306 having been subjected to radiation 302 may recrystallize as it solidifies from a molten state. In various implementations, pulsed optical radiation forming radiation 302 may be provided by a KrF excimer laser and may be supplied through a collimating telescope, a copper single-slit mask, and/or a lens providing 5× demagnification (these items have not be illustrated in FIGS. 3A/3B in the interests of clarity). For instance, for a Cu metal layer, KrF excimer laser fluences of approximately about 400 mJ/cm$^2$ to about 900 mJ/cm$^2$ may be employed.

As shown in FIG. 3B, laser radiation 302 may be provided to portion 306 by scanning a fluence region 305 along direction X-X' where direction X-X' is approximately orthogonal to incidence of radiation direction Z-Z'. Region 305 corresponds to an area of portion 306 being subjected to radiation 302. Correspondingly, after scanning region 305 across portion 306, metal layer 308 may be characterized as being directionally recrystallized or solidified along direction X-X'.

Substrate 310 and/or the laser source providing radiation 302 may be moved relative to each other using known transport systems so that region 305 may be scanned across all of portion 306. Further, in some implementations, substrate 310 and/or radiation 302 may be moved relative to each other so that, for example, radiation 302 may be scanned across portion 306 along another direction Y-Y' after portion 306 has been directionally recrystallized along direction X-X'. Having done so, metal layer 308 may be further characterized as being directionally recrystallized or solidified along both directions X-X' and Y-Y'.

Returning discussion to FIGS. 1 and 2, process 100 may continue from block 106 to block 108, "CONTINUE?", which is a determination block that determines whether to continue process 100 further. If block 108 results in a determination to end process 100 then a structure similar to that shown in FIG. 2D may result including a substrate 202 bearing an at least partially recrystallized metal layer 208 capped by a dielectric material layer 206. Recrystallized metal layer 208 may then be suitable for the growth of graphene monolayers at a later juncture after removal of cap layer 206.

In various implementations a recrystallized metal layer suitable for growing graphene monolayers may include metal grains sizes that are substantially larger than metal grains sizes of a metal layer that has not been subjected to directional recrystallization. For example, where non-recrystallized metal layer 204 has been formed by sputter deposition of Cu, metal layer 204 may have grain sizes of approximately 0.1 μm in length or smaller. In contrast, subsequent to laser directional recrystallization in block 106, the corresponding recrystallized metal layer 208 may have metal grain lengths of at least 15 pm or larger. Correspondingly, a recrystallized metal layer 208 suitable for the growth of graphene monolayers may have an average grain boundary area density at least one hundred and fifty (150) times smaller than an average grain boundary area density of metal layer 204. A recrystallized metal layer having grain lengths of at least 15 μm or larger may therefore be suitable for the formation of a graphene monolayer having a length of about 15 μm or more.

Figure 2E:
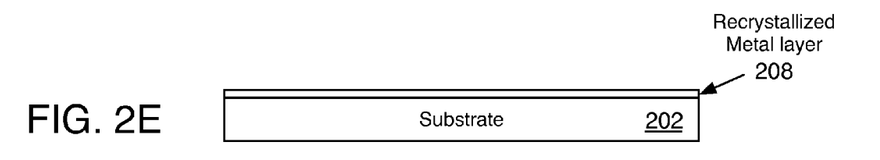

Returning to the discussion of process 100, if block 108 results in a determination to continue process 100 then block 106 may be followed by block 110, "REMOVE DIELECTRIC MATERIAL LAYER", where the dielectric material layer may be removed. For example, in various implementations, the dielectric material layer may be removed using known wet and/or dry etch techniques. FIG. 2E illustrates the removal of dielectric material layer 206 from recrystallized metal layer 208 and substrate 202. Block 110 may be followed by block 112.

Figure 2F:
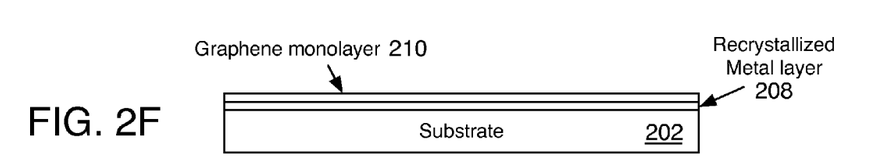

At block 112, "FORM GRAPHENE MONOLAYER ON RECRYSTALLIZED METAL LAYER", a graphene monolayer having a length of at least 15 μm may be formed on the recrystallized metal layer. For example, in various implementations, a graphene monolayer may be formed on a recrystallized metal layer using chemical vapor deposition (CVD) in a hydrocarbon gas mixture. FIG. 2F illustrates the formation of a graphene monolayer 210 having a length of about 15 μm or more on recrystallized metal layer 208.

Figure 4:
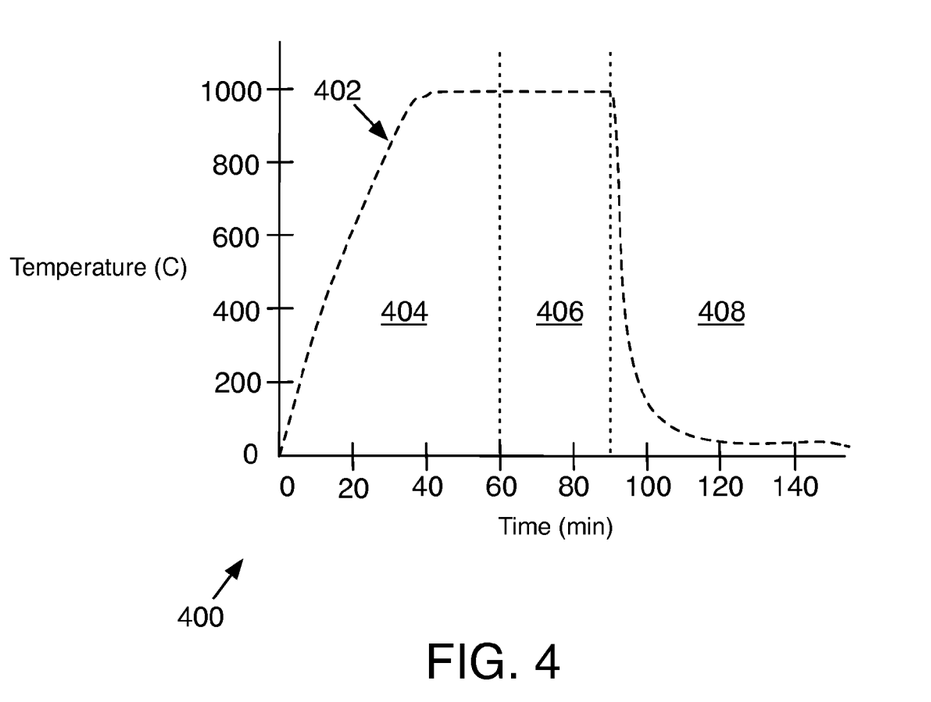
FIG. 4 is an illustrative diagram of example process conditions.

FIG. 4 illustrates example process conditions 400 for forming a graphene monolayer that may be utilized in block 112 of process 100 in accordance with at least some embodiments described herein. While conditions 400 are provided herein as one example of conditions suitable for growing a graphene monolayer, claimed subject matter is not limited to the example of conditions 400 or to any particular process or process conditions for forming a graphene monolayer on a metal layer.

In example conditions 400, referring also to FIGS. 1 and 2F, formation of a graphene monolayer may proceed in block 112 by placing an assembly including substrate 202 and recrystallized metal layer 208 in a CVD system and generally following a process temperature profile as indicated by dashed line 402. In an initial phase 404 the assembly may be gradually heated to a temperature of about 1000° C. under a hydrogen ($H_2$) gas flow rate of approximately 2 Standard Cubic Centimeters per Minute (SCCM) at a total CVD system pressure of approximately 40 mTorr. Subsequently, in phase 406, a graphene monolayer may be formed on the recrystallized metal layer by maintaining the temperature at about 1000° C. while exposing the assembly to a hydrocarbon gas mixture provided by the combination of the 2 SCCM $H_2$ flow rate and a methane ($CH_4$) flow rate of approximately 35 SCCM at a total CVD system pressure of approximately 500 mTorr. Finally, in phase 408, the assembly may be maintained under the same gas mixture and pressure conditions of phase 406 while the assembly is allowed to cool down to ambient temperatures.

Referring to FIG. 2F, after formation, the graphene monolayer 210 may be removed or isolated from recrystallized metal layer 208 and substrate 202. For example, in various implementations, prior to removing graphene monolayer 210 it may first be protected by coating with polydimethylsiloxane (PDMS) or poly-methyl methacrylate (PMMA). If substrate 202 is silica based then the substrate may be abrasively thinned followed by known chemical etching techniques using solutions of HF and/or fluoroboric acid. If formed from other materials, substrate 202 may be removed using known acid etch solutions. Recrystallized metal layer 208 may then be removed using an etching solution containing iron nitrate. Finally, graphene monolayer 210, having been isolated from recrystallized metal layer 208 and substrate 202, may be transferred to a test structure or circuit and the protective coating may be removed using acetone or known photoresist strippers. Further, referring to FIGS. 2B/2C, in various implementations prior to forming dielectric material layer 206, metal layer 204 may be polished using known chemical mechanical polishing techniques.

In some implementations, recrystallized metal layer 208 may be selectively removed from between graphene monolayer 210 and substrate 202. For example, graphene monolayer 210 may first be protected by coating with PDMS or PMMA. Subsequently, recrystallized metal layer 208 may be removed using an etching solution containing iron nitrate followed by removal of the protective coating using acetone or known photoresist strippers.

Figure 5:
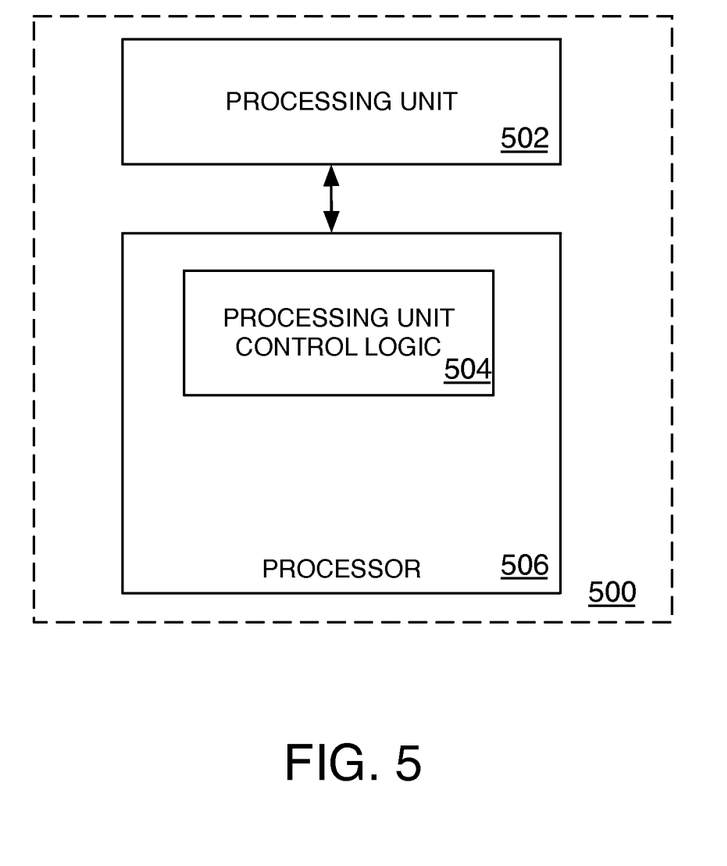
FIG. 5 is an illustrative diagram of an example system for implementing at least portions of the process of FIG. 1.

FIG. 5 illustrates an example system 500 for manufacturing devices and/or systems employing substrates suitable for forming a graphene monolayer in accordance with at least some implementations of the present disclosure. System 500 may include a processing unit 502 operably coupled to a processor 506 that may include processing unit control logic 504. Processing unit 502 may include any arrangement of production and assembly tools and/or systems, such as one or more devices configured to undertake the manufacture of devices and/or systems such as those illustrated in FIGS. 1-4 using, for example, process 100.

Processing unit control logic 504 may be configured to provide functional control of any arrangement of production and assembly tools and/or systems, such as CVD systems, and may include hardware, software or firmware logic and/or any combination thereof although claimed subject matter is not limited to specific types or manifestations of processing unit control logic. Processor 506 may be a microprocessor or Central Processing Unit (CPU). In other implementations, processor 506 may be an Application Specific Integrated Circuit (ASIC), a Field Programmable Gate Array (FPGA), a digital signal processor (DSP), or other integrated formats. Processor 506 and processing unit 502 may be configured to communicate by any suitable means, such as, for example, by wired connections or wireless connections.

Figure 6:
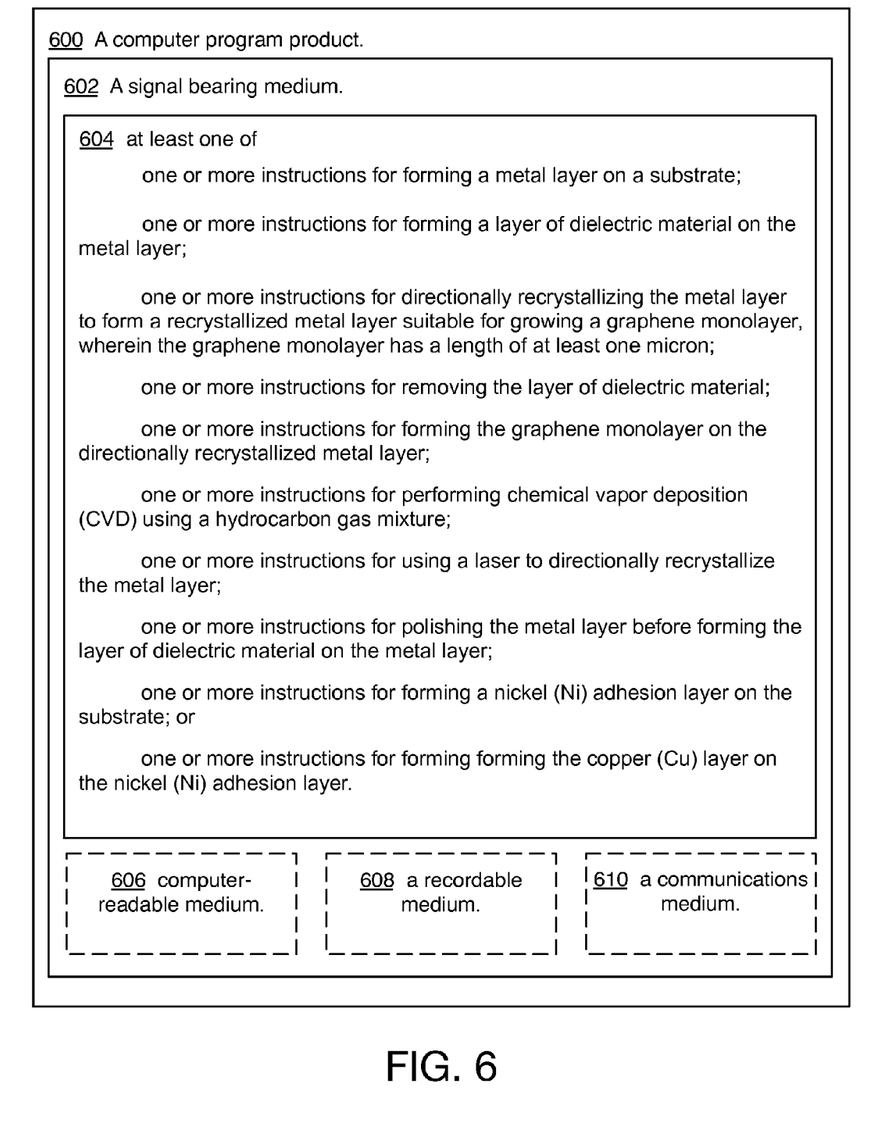
FIG. 6 is an illustration of an example computer program product.

FIG. 6 illustrates an example computer program product 600 arranged in accordance with at least some examples of the present disclosure. Program product 600 may include a signal bearing medium 602. Signal bearing medium 602 may include one or more instructions 604 that, when executed by, for example, a processor, may provide the functionality described above with respect to FIG. 1. Thus, for example, referring to the system of FIG. 5, processor 506 and/or processing unit control logic 504 may undertake one or more of the blocks shown in FIG. 1 in response to instructions 604 conveyed by medium 602.

In some implementations, signal bearing medium 602 may encompass a computer-readable medium 606, such as, but not limited to, a hard disk drive, a Compact Disc (CD), a Digital Versatile Disk (DVD), a digital tape, memory, etc. In some implementations, signal bearing medium 602 may encompass a recordable medium 608, such as, but not limited to, memory, read/write (R/W) CDs, R/W DVDs, etc. In some implementations, signal bearing medium 602 may encompass a communications medium 610, such as, but not limited to, a digital and/or an analog communication medium (e.g., a fiber optic cable, a waveguide, a wired communications link, a wireless communication link, etc.). Thus, for example, referring to the system of FIG. 5, program product 600 may be wirelessly conveyed to processor 506 by signal bearing medium 602, where signal bearing medium 602 is conveyed to system 500 by a wireless communications medium 610 (e.g., an wireless communications medium conforming with the 802.11 standard).

Figure 7:
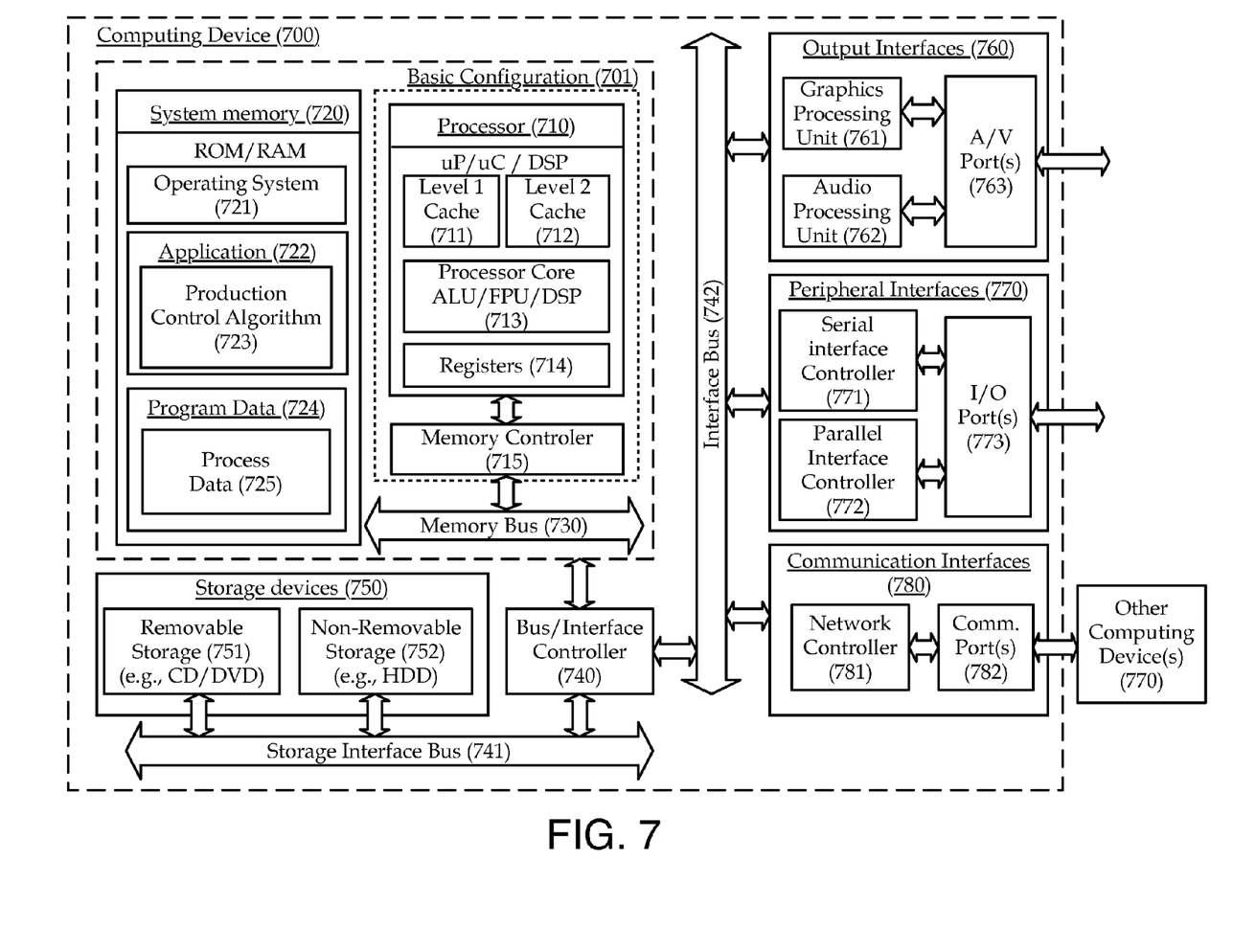
FIG. 7 is an illustration of an example computing device, all arranged in accordance with at least some embodiments of the present disclosure.

FIG. 7 is a block diagram illustrating an example computing device 700. In some examples, control of the manufacturing of substrates suitable for growing a graphene monolayer may be provided by computing device 700. In a very basic configuration 701, computing device 700 typically includes one or more processors 710 and system memory 720. A memory bus 730 can be used for communicating between the processor 710 and the system memory 720.

Depending on the desired configuration, the system memory 720 can be of any type including but not limited to volatile memory (such as RAM), non-volatile memory (such as ROM, flash memory, etc.) or any combination thereof. System memory 720 typically includes an operating system 721, one or more applications 722, and program data 724. Application 722 may include instructions 723 that are arranged to perform the functions as described herein including the actions described with respect to providing control of production systems that may undertake actions described with respect to the flow chart shown in FIG. 1. Program Data 724 may include process data 725 that may be useful for implementing instructions 723. In some examples, application 722 can be arranged to operate with program data 724 on an operating system 721 such that implementations of producing substrates suitable for growing graphene, as described herein, may be provided. This described basic configuration is illustrated in FIG. 7 by those components within dashed line 701.

Computing device 700 can have additional features or functionality, and additional interfaces to facilitate communications between the basic configuration 701 and any required devices and interfaces. For example, a bus/interface controller 740 can be used to facilitate communications between the basic configuration 701 and one or more data storage devices 750 via a storage interface bus 741. The data storage devices 750 can be removable storage devices 751, non-removable storage devices 752, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 720, removable storage 751 and non-removable storage 752 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer storage media can be part of device 700.

Computing device 700 can also include an interface bus 742 for facilitating communication from various interface devices (e.g., output interfaces, peripheral interfaces, and communication interfaces) to the basic configuration 701 via the bus/interface controller 740. Example output interfaces 760 include a graphics processing unit 761 and an audio processing unit 762, which can be configured to communicate to various external devices such as a display or speakers via one or more NV ports 763. Example peripheral interfaces 760 include a serial interface controller 771 or a parallel interface controller 772, which can be configured to communicate with external devices such as input devices (e.g., keyboard, mouse, pen, voice input device, touch input device, etc.) or other peripheral devices (e.g., printer, scanner, etc.) via one or more I/O ports 773. An example communication interface 780 includes a network controller 781, which can be arranged to facilitate communications with one or more other computing devices 790 over a network communication via one or more communication ports 782. A network communication connection is one example of a communication media.

Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 700 can be implemented as a portion of a small-form factor portable (or mobile) electronic device such as a cell phone, smart phone, a personal data assistant (PDA), a personal media player device, a wireless web-watch device, a personal headset device, an application specific device, or a hybrid device that include any of the above functions. Computing device 900 can also be implemented as a personal computer including both laptop computer and non-laptop computer configurations or implemented in a workstation or a server configuration.

References made in this disclosure to the term "responsive to" or "in response to" are not limited to responsiveness to only a particular feature and/or structure. A feature may also be responsive to another feature and/or structure and also be located within that feature and/or structure. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application.

The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It should also be understood that, the term "optimize" may include maximization and/or minimization. The term "minimization" and/or the like as used herein may include a global minimum, a local minimum, an approximate global minimum, and/or an approximate local minimum. Likewise, it should also be understood that, the term "maximization" and/or the like as used herein may include an global maximum, a local maximum, an approximate global maximum, and/or an approximate local maximum.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method comprising:
   forming a metal layer on a substrate;
   forming a layer of dielectric material on the metal layer; and
   directionally recrystallizing the metal layer to form a recrystallized metal layer suitable for growing a graphene monolayer, wherein the graphene monolayer has a length of about fifteen microns or greater.

2. The method of claim 1, further comprising:
   removing the layer of dielectric material; and
   forming the graphene monolayer on the directionally recrystallized metal layer.

3. The method of claim 2, wherein forming the graphene monolayer on the recrystallized metal layer comprises performing chemical vapor deposition (CVD) using a hydrocarbon gas mixture.

4. The method of claim 1, wherein directionally recrystallizing the metal layer comprises using a laser to melt at least a portion of the metal layer.

5. The method of claim 1, further comprising polishing the metal layer before forming the layer of dielectric material on the metal layer.

6. The method of claim 1, wherein the metal layer comprises one or more of nickel (Ni), ruthenium (Ru) and/or copper (Cu).

7. The method of claim 1, wherein the metal layer comprises a copper (Cu) layer and wherein the method further comprises:
   forming a nickel (Ni) adhesion layer on the substrate; and
   forming the copper (Cu) layer on the nickel (Ni) adhesion layer.

8. The method of claim 1, wherein the layer of dielectric material comprises silicon dioxide ($SiO_2$).

9. The method of claim 1, wherein the substrate comprises a controlled thermal expansion substrate coated with silicon dioxide ($SiO_2$).

10. The method of claim 9, wherein the controlled thermal expansion substrate has a thermal expansion coefficient of about $0.5 \times 10^{-6}$/K or more.

11. A device comprising:
    a layer of dielectric material adjacent a substrate; and
    a directionally recrystallized metal layer adjacent the layer of dielectric material, wherein the directionally recrystallized metal layer comprises a metal layer suitable for growing a graphene monolayer, wherein the graphene monolayer has a length of about fifteen microns or greater.

12. The device of claim 11, wherein the graphene monolayer is adjacent the directionally recrystallized metal layer.

13. The device of claim 11, wherein the directionally recrystallized metal layer comprises a metal layer directionally recrystallized by laser directional solidification.

14. The device of claim 11, wherein the directionally recrystallized metal layer comprises one or more of nickel (Ni), ruthenium (Ru) and/or copper (Cu).

15. The device of claim 11, wherein the substrate comprises a controlled thermal expansion substrate coated with silicon dioxide ($SiO_2$).

16. A system comprising:
  one or more devices configured to:
    form a metal layer on a substrate;
    form a dielectric layer on the metal layer; and
    directionally recrystallize the metal layer to form a metal layer suitable for growing a graphene monolayer, wherein the graphene monolayer has a length of at least about fifteen microns.

17. The system of claim 16 wherein the one or more devices are further configured to:
  remove the dielectric layer; and
  form the graphene monolayer on the directionally recrystallized metal layer.

18. The system of claim 16, wherein the one or more devices are configured to directionally recrystallize the metal layer by applying laser directional solidification to the metal layer.

19. The system of claim 16, wherein the metal layer comprises one or more of nickel (Ni), ruthenium (Ru) and/or copper (Cu).

20. The system of claim 16, wherein the substrate comprises a controlled thermal expansion substrate.

* * * * *

UNITED STATES PATENT AND TRADEMARK OFFICE
CERTIFICATE OF CORRECTION

PATENT NO. : 8,492,753 B2
APPLICATION NO. : 13/129371
DATED : July 23, 2013
INVENTOR(S) : Yager Page 1 of 2

It is certified that error appears in the above-identified patent and that said Letters Patent is hereby corrected as shown below:

In the Drawings:

In Fig. 7, Sheet 7 of 7, in Box "(710)", Line 1, delete "uP/ uC / DSP" and insert -- µP/ µC/ DSP --, therefor. (See Attached Sheet)

In Fig. 7, Sheet 7 of 7, in Box "(715)", Line 1, delete "Controler" and insert -- Controller --, therefor.

In the Specification:

In Column 4, Line 32, delete "RECRYSTALIZE" and insert -- RECRYSTALLIZE --, therefor.

In Column 5, Line 35, delete "15 pm" and insert -- 15 µm --, therefor.

In Column 8, Line 36, delete "NV ports" and insert -- A/V ports --, therefor.

In the Claims:

In Column 13, Line 18, in Claim 17, delete "claim 16" and insert -- claim 16, --, therefor.

Signed and Sealed this
Twelfth Day of November, 2013

Teresa Stanek Rea
*Deputy Director of the United States Patent and Trademark Office*

FIG. 7